United States Patent [19]

Fagen

[11] Patent Number: 5,276,348
[45] Date of Patent: Jan. 4, 1994

[54] DOT MATRIX PATTERN ON PHOTOSENSITIVE SEMI-CONDUCTOR SURFACE

[75] Inventor: Shawn J. Fagen, Santa Monica, Calif.

[73] Assignee: Advanced Photonix, Inc., Camerillo, Calif.

[21] Appl. No.: 895,798

[22] Filed: Jun. 9, 1992

[51] Int. Cl.$^5$ ............................................. H01L 27/14
[52] U.S. Cl. ..................... 257/435; 257/437; 257/448; 257/459; 257/458
[58] Field of Search ............... 257/443, 435, 448, 437, 257/461, 459, 458, 440, 59

[56] References Cited

U.S. PATENT DOCUMENTS

| | | | |
|---|---|---|---|
| 4,972,243 | 11/1990 | Sugawa | 257/435 |
| 5,172,206 | 12/1992 | Iizuka | 257/294 X |

FOREIGN PATENT DOCUMENTS

| | | | |
|---|---|---|---|
| 59-172768 | 9/1984 | Japan | 257/435 |
| 3500645 | 7/1985 | Japan | 257/435 |
| 61-292360 | 12/1986 | Japan | 257/435 |

*Primary Examiner*—William Mintel
*Attorney, Agent, or Firm*—Herbert M. Shapiro

[57] ABSTRACT

A photosensitive semi-conductor device is disclosed having a matrix of non-translucent dots on its photosensitive surface. In an array of photosensitive semi-conductor devices, such as photodiodes, the non-translucent dot pattern applied to this photosensitive surface of each photodiode is used to regulate the output from each photodiode. The dot matrix is preferably sputtered onto the anti-reflection coating of the photosensitive surface of the photodiode.

14 Claims, 2 Drawing Sheets

DOT MATRIX PATTERN ON PHOTOSENSITIVE SEMI-CONDUCTOR SURFACE

BACKGROUND OF THE INVENTION

This invention relates generally to photosensitive semi-conductor devices, and more particularly to photodiodes.

Photosensitive semi-conductors are used to translate optical information into electrical signals for processing. One type of photosensitive semi-conductor device is a photodiode which generates a current proportional to the light illuminating its photosensitive surface. Typically, amplifiers are required to increase the electrical current generated by a photodiode to a level sufficient for processing.

Photosensitive semi-conductors constructed of silicon vary in their sensitivity to different wavelengths of light. For example, a silicon-based photodiode typically generates more current from the same wattage of a longer wavelength of light than it would for the same wattage of a shorter wavelength of light. Therefore, the signal from a photodiode receiving a certain wattage of light of a shorter wavelength must be amplified more than the signal from an identical photodiode receiving the same wattage of light of a longer wavelength. In addition, optical filters placed directly on the photosensitive surface, with different transmission properties create a further disparity between wavelengths of light, and their resulting signal currents.

In many applications for photodiodes, an array of photodiodes is used with individual photodiodes in the array receiving specific wavelengths of light, or with individual or groups of photodiodes having filters for different wavelengths of light placed directed on the photodiodes. The problem then arises of having to provide different amounts of amplification for the signals from the individual photodiodes.

One application for photodiodes or arrays of photodiodes is in analyzers for blood and other bodily fluids. Certain characteristics of the fluid can be determined from the degree to which the fluid transmits, reflects, and absorbs different wavelengths of light. For example, in a blood analyzer, a light source is placed on one side of a fluid sample with an array of photodiodes on the opposite side of the sample. The photodiode array typically has a filter in front of it which directs different wavelengths of light to different photodiodes in the array. In other words, each individual photodiode only receives light of a discrete wavelength. The signals generated by each photodiode in the array are then amplified to a level sufficient for processing. Information about the sample of fluid can then be determined by analyzing the amount of each wavelength of light which was detected by the photodiode array.

One approach previously utilized in such applications is to have amplifiers of different ranges for each of the photodiodes. Again, that is necessary because the photodiodes which receive the shorter wavelengths of light require much greater amplification of their signals than do the photodiodes which receive the longer wavelength of lights. In addition, optical filters placed directly on the photosensitive surface, with different transmission properties create a further disparity between different wavelengths of light, and their resulting signal currents. However, it is costly to provide amplifiers with different amplification powers for each photodiode in the array.

Another possible solution to this situation is to "energy match" each photodiode in an array for a particular application so that the same wattage of a shorter wavelength of light applied to one photodiode creates the same amount of current (signal) as the same wattage of a longer wavelength of light applied to another photodiode. Each "energy matched" photodiode can then use an identical amplifier.

One way to energy match the photodiodes is to use a reticule (an opaque material with a slit in it) to limit the amount of light which is permitted to strike the photosensitive surface of each photodiode to varying degrees depending upon the wavelength of light which will be received by that particular photodiode. In the past opaque glass, metal or plastic reticules have been used for this purpose. However, these reticules have been relatively thick with the effect that if the light source is not perfectly perpendicular to the photosensitive surface the slits in the surface of the reticule block out some portion of the available light signal due to deflection. The possibility of deflection requires that the light source be extremely stable and exactly aligned. Metal reticules may also cause the additional problem of creating unwanted capacitance.

It is therefore desirable to have a way of regulating the amount of filtered or unfiltered light impinging on the array which does not block some portion of the available light if the light source is not perfectly perpendicular to the photosensitive surface and also does not cause any capacitance.

SUMMARY OF THE INVENTION

In accordance with a specific illustrative embodiment of the present invention, an array of photodiodes is formed as a single monolithic device. A photosensitive surface of each photodiode is covered with a pattern of non-translucent shielding members in order to energy match the output of each photodiode.

Photosensitive semiconductor devices made from silicon typically produce a larger current response in reaction to longer wavelengths of light than to shorter wavelengths of light. Therefore, in applications where individual photodiodes in an array receive different wavelengths of light, it is desirable to "energy match" the individual photodiodes so that each diode produces the same current signal in response to light signals of the same power but different wavelengths. Energy matching allows for each photodiode to use an identical amplifier, thus providing a cost savings.

Energy matching in the present device is accomplished by obscuring the photosensitive surface area of each pixel with a non-translucent shielding members. The shielding members may be a dot matrix pattern which is sputtered onto the anti-reflection coating of each photodiode. The dot matrix pattern for each photodiode is determined according to the wavelength of light which that photodiode will receive in a particular application.

The dot matrix pattern would be typically applied by sputtering titanium or aluminum onto the photosensitive surface of the photodiodes utilizing a chip mask. Energy matched arrays of photodiodes can then be easily mass produced through the use of different chip masks.

Other objects, features and advantages of the present invention will become apparent from a consideration of

DETAILED DESCRIPTION OF THE PREFERRED EMBODIMENT

Figure 1:
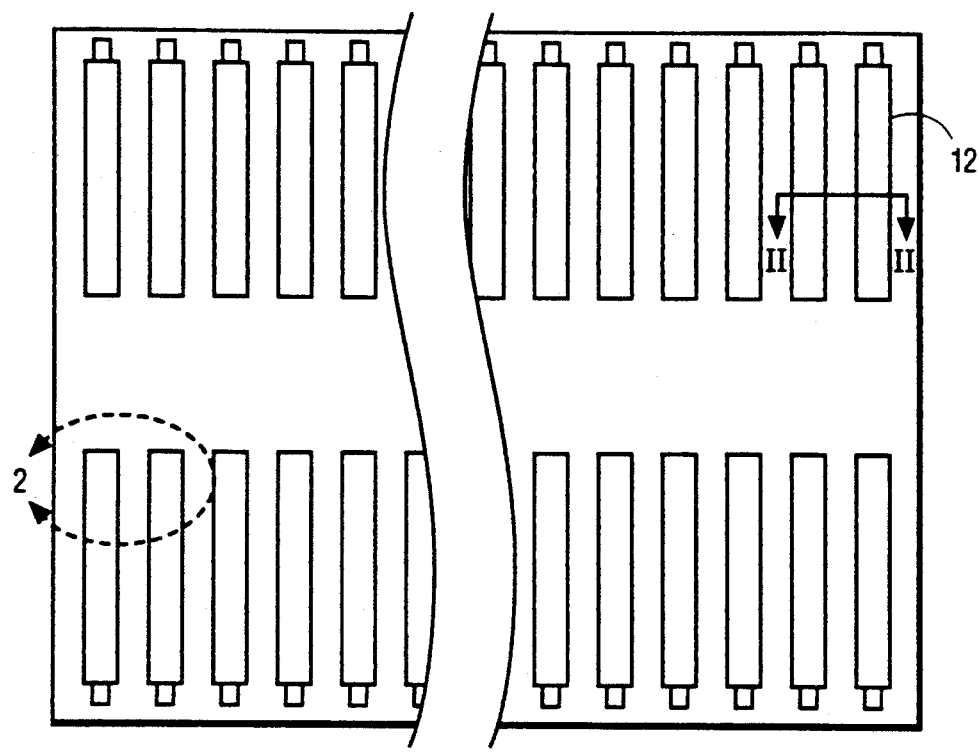
FIG. 1 is a top view of a photodiode array.
Figure 3:
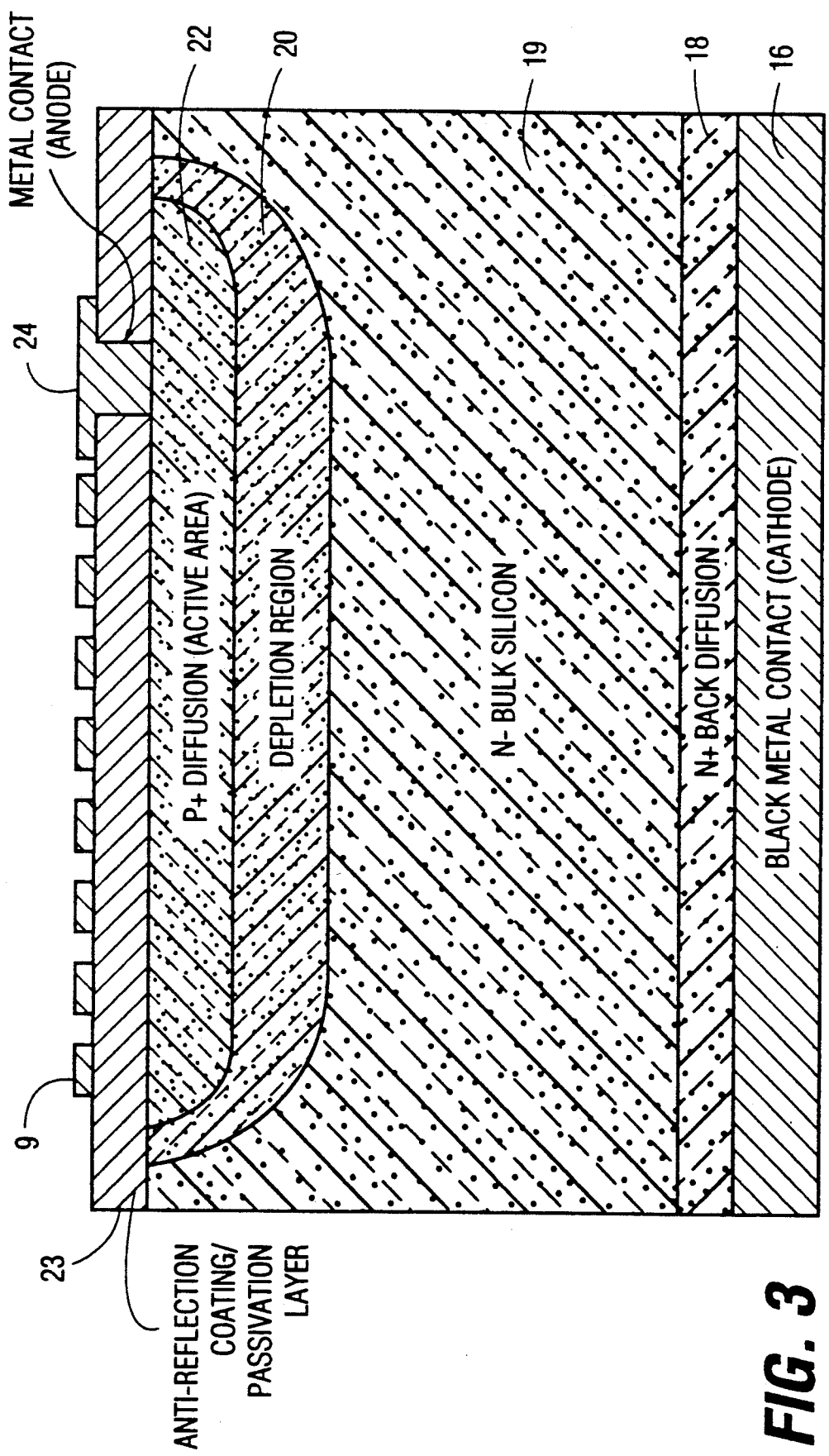
FIG. 3 is a detailed cutaway view of an individual photodiode.

Referring more particularly to the drawings, FIG. 1 shows an array of photodiodes as contemplated by the present invention. Each photodiode 12 is formed in a semi-conductor substraight. FIG. 3 shows a cross-sectional view of an individual photodiode. The construction of the photodiode is of the typical P on N type commonly known by those skilled in the art.

The array of photodiodes, as shown in FIG. 1, is a single monolithic semi-conductor device containing a series of photodiodes or pixels 12. In a typical application, it is intended that each pixel receive a specific, predetermined wavelength of light. Knowing in advance what wavelength each pixel will receive and the approximate maximum and minimum power of the light signal to be received, each pixel can then be energy matched so that each pixel will produce the same current in response to the same wattage of light received on its active surface. This will be true even though each pixel is receiving light of a different wavelength.

The energy matching is accomplished by shielding members located on the photosensitive surface of each photodiode. The shielding members are formed by sputtering a series of nontranslucent aluminum or titanium (or other similar material) dots 9 (shown in FIG. 2) over the light sensitive active area of each pixel. The size of the dots and the number of dots per given unit of surface area can be varied to precisely control the amount of light each pixel receives. Alternatively, the shielding members 9 could be a thin layer of epoxy or similar non-translucent material.

Figure 2:
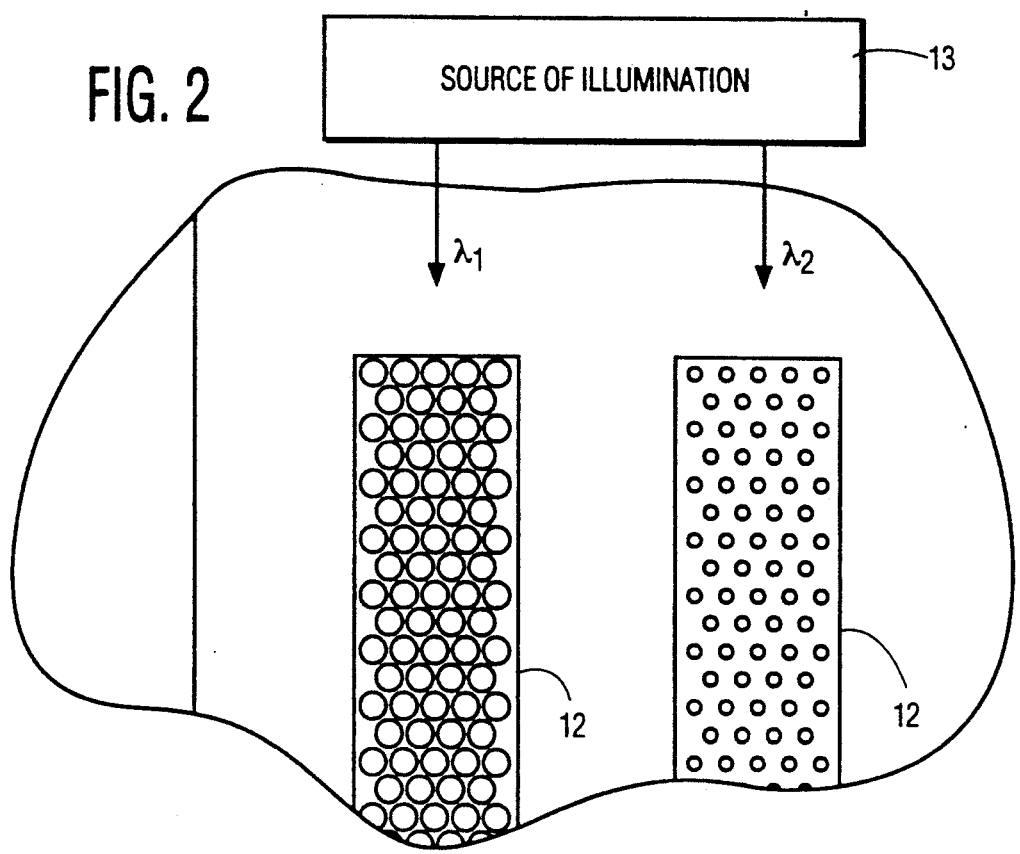
FIG. 2 is a detailed view of a portion of two of the individual photodiodes shown in FIG. 1.

FIG. 2 shows in detail a portion of two pixels 12 with different dot matrix patterns applied to them. FIG. 2 also shows a source of illumination 13 directing light of two different wavelengths λ1 and λ2 to two different pixels. The source of illumination represents a light source and an optical filter system or similar device which separates incoming light into its component wavelengths and directs individual components (wavelengths) to different pixels.

The pattern of dots or dot matrix pattern which is applied to the surface of each photodiode is determined by the parameters of the particular application in which the photodiode will be used. The two controlling parameters are the wavelength of the light signal which the photodiode will receive and the expected range of the power or strength (wattage) of that light signal due to the source of light itself and any intervening filter or grating. Ordinarily the power of the light signals supplied to each of the photodiodes would be the same. Once those two parameters (wavelength and power) are determined for each photodiode in the array, then the percentage of surface area to be obscured by the dots in the dot matrix pattern can be calculated for each photodiode in the array.

For example, if one photodiode receives a 10 milliwatt infrared light signal which would cause it to generate a 6 milli-amp signal and a second photodiode receives a 10 milliwatt ultra violet light signal which would cause it to generate a 2 milli-amp signal, then two-thirds of the active surface area of the first photodiode would need to be covered with dots to bring the signal generated by that photodiode down to 2 milli amps.

The amount of current generated by a photodiode in response to a certain wavelength of light at a certain power level (wattage) can be easily determined and is commonly known for most commercially available photodiodes. Therefore, once the wavelengths and power of the light signal to be received by each photodiode is known, the percentage of surface area of each photodiode to be covered by dots can be easily determined to keep the signal generated by each photodiode in the same range. In that manner, the signal from each photodiode can be amplified by an identical amplifier.

Except for the application of the dots to the photosensitive surface of the photodiodes, the construction of the photodiodes of the present invention is that of a typical P on N type photodiode. As shown in FIG. 3, each individual photodiode has a back metal contact 16, the cathode. On top of the back-metal contact 16 is the back diffusion layer 18, which is followed by the intermediate or bulk silicon layer 19. The bulk silicon layer 19 has formed within it a depletion region 20. The positively doped diffusion layer 22 (the active area) located on top of the depletion region 20. The anti-reflection coating 23 (the passivation layer) is applied on top of the photodiode overlying the active area 22. A small region of the anti-reflection coating 23 is etched away to form a contact region to the diffusion layer 22 for the metal contact 24 (the anode). The metal contact 24 is formed by sputtering aluminum or titanium into the small hole in the anti-reflection coating 23 forming an anode from the active area 22 up through the anti-reflection coating 23.

Finally, the dot matrix pattern composed of individual dots 9 is sputtered onto the surface of the anti-reflection coating 23. A chip mask having the appropriate pattern for the predetermined dot matrix pattern is utilized in sputtering the dot pattern onto the surface of the anti-reflection coating 23. The dots 9 are preferably formed by sputtering aluminum or titanium which would ordinarily be the same material from which the metal contact 24 is formed. The dots 9 are electrically and physically isolated from the anode 24 and therefore do not create any unwanted capacitate.

The size of the dots used to obscure the surface area of the photodiode effects the tolerance of the energy matching. The smaller the dots are, the more accurate the energy matching. The dots need not be circular in shape, dots of any known surface area can be used.

In conclusion, it is to be understood that the foregoing detailed description and the accompanying drawings relate to one illustration embodiment of the present invention. However, the present invention may be implemented by other structures and methods. For example, the underlying photosensitive semiconductor could be of a gallium arsenide structure or the non-translucent shield members could be formed by applying epoxy or similar materials to the photosensitive surface. Accordingly, the present invention is not limited to the illustrative embodiments shown in the drawings and described herein above but is to be limited only to the following claims.

What is claimed:

1. A photosensitive semiconductor device comprising an array of photodiodes, each of said photodiodes having a cathode, an anode and a photosensitive surface; a plurality of nontranslucent shielding members on said photosensitive surface, said shielding members being isolated from said anode and cathode in each of said photodiodes, the photosensitive surface of each of said photodiodes having a pattern of said shielding members which differs from one another to occlude different areas of the photodiode surfaces for controlling the amount of light energy each photodiode receives for achieving energy matching of that light energy.

2. A photosensitive semiconductor device as described in claim 1 wherein said shielding members are a matrix of dots sputtered onto said photosensitive surface.

3. A photosensitive semiconductor device as described in claim 2 wherein said dots are comprised of a material selected from the group consisting of aluminum and titanium.

4. An array of photosensitive semiconductor devices each comprising:
   an underlying back metal contact layer;
   a back diffusion layer overlying said back contact layer;
   an intermediate layer having a lower surface in contact with said back diffusion layer and an upper surface;
   a depletion region formed in the upper surface of said intermediate layer;
   an active area also formed within the upper surface of said intermediate layer and overlying said depletion region;
   an anti-reflection coating overlying said diffusion layer;
   an anode extending from said diffusion layer through said anti-reflection coating; and
   a plurality of non-translucent shielding members overlying said anti-reflection coating, each shielding member being isolated from said anode.

5. An array as described in claim 4, wherein each of said photosensitive semiconductor devices is a photodiode.

6. An array as defined in claim 4 wherein said plurality of shielding members comprises dots of aluminum sputtered onto said anti-reflection coating.

7. An array as defined in claim 4 wherein said plurality of shielding members comprises dots of titanium sputtered onto said anti-reflection coating.

8. An array of photosensitive devices each as set forth in claim 4, said array being formed as a single monolithic device.

9. A light evaluating system comprising including an array of photodiodes each having a photosensitive surface, each of said photodiodes having a pattern of non-translucent members overlying said photosensitive surface differently for each of said photodiodes to occlude different areas of said surface for ensuring that equal amounts of light energy impinge the surfaces of the photodiodes; and a source of illumination including a light source and an optical filter system for directing different wavelengths of light from said source of illumination to different ones of said photodiodes.

10. A light evaluation system as described in claim 9, wherein said array is formed as a single monolithic device.

11. A light evaluating system as defined in claim 9 wherein each of said photodiodes comprises:
   an underlying back metal contact layer;
   a back diffusion layer overlying said back contact layer;
   an intermediate layer having a lower surface in contact with said back diffusion layer and an upper surface;
   a depletion region formed in the upper surface of said intermediate layer;
   an active area also formed within the upper surface of said intermediate layer and overlying said depletion region;
   an anti-reflection coating overlying said diffusion layer;
   an anode extending from said diffusion layer through said anti-reflection coating; and
   a plurality of non-translucent shielding members overlying said anti-reflection coating, each shielding member being isolated from said anode.

12. A light evaluating system as defined in claim 9 wherein said plurality of non-translucent shielding members includes a plurality of aluminum dots sputtered onto said anti-reflection coating.

13. A light evaluating system as defined in claim 9 wherein said plurality of non-translucent shielding members includes a plurality of titanium dots sputtered onto said anti-reflection coating.

14. A light evaluating system as defined in claim 9 wherein an amount of surface area of each said photodiode which is covered by said non-translucent shielding members varies according to the wavelength of light the photodiode is intended to receive.

* * * * *